(12) United States Patent
Micheloni et al.

(10) Patent No.: US 7,529,136 B2
(45) Date of Patent: May 5, 2009

(54) METHOD FOR COMPACTING THE ERASED THRESHOLD VOLTAGE DISTRIBUTION OF FLASH MEMORY DEVICES DURING WRITING OPERATIONS

(76) Inventors: Rino Micheloni, Via Como, 8, I-22078 Turate (CO) (IT); Luca Crippa, Via Manzoni, 66, I-20040 Busnago (MI) (IT); Roberto Ravasio, Via Mazzini, 3, I-24036 Ponte San Pietro (BG) (IT); Federico Pio, Via Volturno Fontana, 80, I-20047 Brugherio (MI) (IT)

( * ) Notice: Subject to any disclaimer, the term of this patent is extended or adjusted under 35 U.S.C. 154(b) by 58 days.

(21) Appl. No.: 11/844,480

(22) Filed: Aug. 24, 2007

(65) Prior Publication Data
US 2008/0049521 A1    Feb. 28, 2008

(30) Foreign Application Priority Data
Aug. 24, 2006   (EP)   .................................. 06119452

(51) Int. Cl.
*G11C 16/04*   (2006.01)
(52) U.S. Cl. ............................ 365/185.24; 365/185.18; 365/185.33
(58) Field of Classification Search ............ 365/185.11, 365/185.18, 185.22, 185.24, 185.33
See application file for complete search history.

(56) References Cited

U.S. PATENT DOCUMENTS

| | | | |
|---|---|---|---|
| 5,452,248 A | 9/1995 | Naruke et al. | |
| 6,381,670 B1 | 4/2002 | Lee et al. | |
| 6,438,037 B1 | 8/2002 | Fastow et al. | |
| 7,173,852 B2 * | 2/2007 | Gorobets et al. | ....... 365/185.09 |
| 2004/0114437 A1 | 6/2004 | Li | |
| 2005/0276120 A1 * | 12/2005 | Hsia et al. | .............. 365/185.33 |

OTHER PUBLICATIONS

European Search Report from corresponding European Application No. 06119452, filed Aug. 24, 2006.

* cited by examiner

*Primary Examiner*—Gene N. Auduong
(74) *Attorney, Agent, or Firm*—Blakely, Sokoloff, Taylor & Zafman LLP

(57) ABSTRACT

A method for operating a flash memory device. The memory device includes a matrix of memory cells each one having a programmable threshold voltage defining a value stored in the memory cell. The method includes the steps of erasing a block of memory cells, and compacting the threshold voltages of the memory cells of the block within a predefined compacting range, wherein the step of compacting includes: selecting at least one first memory cell of the block for writing a target value; restoring the threshold voltage of a subset of the memory cells of the block to the compacting range, the subset including the at least one first memory cell and/or at least one second memory cell of the block being adjacent to the at least one first memory cell; and at least partially writing the target value into the at least one first memory cell.

11 Claims, 9 Drawing Sheets

METHOD FOR COMPACTING THE ERASED THRESHOLD VOLTAGE DISTRIBUTION OF FLASH MEMORY DEVICES DURING WRITING OPERATIONS

BACKGROUND OF THE INVENTION

1. Field of the Invention

The present invention relates to the electronics field. More specifically, the present invention relates to flash memory devices.

2. Discussion of the Related Art

Flash memory devices are non-volatile memories wherein each single cell may be programmed electrically, but a large number of cells, forming a block, have to be erased at the same time. Typically, each cell consists of a floating gate MOS transistor, which stores a logic value defined by its threshold voltage (which depends on the electric charge stored on the floating gate). Particularly, in a flash memory device with NAND architecture, the cells are grouped in strings (or stacks), each one consisting of a set of cells that are connected in series. The main advantage of such architecture is the reduced area occupation, essentially due to the reduction of both the contacts number and the cells size. This makes the NAND memory devices particularly advantageous in a number of applications such as memory cards, memories of digital video-cameras and of audio recorders.

The cells are generally erased by applying a single blind erasing pulse to the whole block, which erasing pulse reduces the threshold voltages of the cells below an erase reference value (e.g., 0V). The erasing pulse has to be dimensioned in order to guarantee the erasing of all the cells of the block in the worst conditions, so that it normally brings the threshold voltages of some erased cells to very low values. In such a way, it is obtained a statistical distribution of the threshold voltages of the erased cells (typically, having a roughly Gaussian shape) with a long tail due to the cells having the lowest threshold voltages; this erased distribution is then very large (for example, with a width ranging from 4V to 5V), typically of an order of magnitude higher than each distribution of the threshold voltage of the cells when programmed.

The width of the erased distribution is a problem because of the capacitive coupling between the floating gates of adjacent cells. Indeed, the threshold voltage of each cell dependents non-uniquely on the electric charge stored in its floating gate but also on the electric charges stored in the floating gates of the adjacent cells. Such effect modifies the threshold voltage of the cell whenever the adjacent cells are programmed (being more evident in the NAND memory devices because of their high integration). The suffered variation increases with the amplitude of the gap of the threshold voltages of the adjacent cells. Therefore, the problem is particularly acute when the cells that are programmed start from a very low original threshold voltage. The above-described variation of the threshold voltage can cause an undesired change of the logic value stored in the cell.

Such problem is experienced in standard NAND memory devices but it is more and more limiting in multi-level NAND memory devices wherein each cell stores multiple bits (since the margins that are used for discriminating the different stored logic values are reduced).

In the state of the art, in order to limit the capacitive coupling effect, the cells undergo a so-called "soft-compacting" operation (also known as soft-compression operation) after being erased. For this purpose, a reduced program pulse is indiscriminately applied to all the cells of the block until a predetermined guard value (such as −1V), lower than the erase reference value, is reached. This verification is typically performed at the string level; therefore, as soon as the threshold voltage of at least one cell of each string reaches the guard value, the whole string is not conductive and its soft-compacting operation is stopped. As a result, the threshold voltages of the cells of each string as a whole are shifted accordingly; this causes a shifting and a slight compacting of the whole erased distribution.

However, this solution is not satisfactory. Indeed, the erased distribution substantially maintains the same shape and remains too large with a width (e.g., of 3V) of the same order of magnitude as beforehand, thus leaving unchanged the effects due to the capacitive coupling.

For obtaining a significant reduction of the width of the erased distribution, the above-mentioned verification should have to be applied at the level of every single cell; indeed, in this way its threshold voltage could be brought to the desired value, so as to compact the erased distribution within a suitable range.

However, this solution is untenable in practice, since it would require the verification of all the cells of the block individually, with a detrimental impact on the erasing time of the flash memory device.

SUMMARY OF THE INVENTION

The present invention is based on the idea of compacting the erased distribution before completing a writing operation of each selected cell.

According to one embodiment, there is provided a method for operating a flash memory device including a matrix of memory cells; each memory cell has a programmable threshold voltage, which defines a value stored in the memory cell. The method starts with the step of erasing a block of memory cells. The threshold voltages of the memory cells of the block are then compacted within a predefined compacting range. The step of compacting includes the following operations. At first at least one first memory cell of the block is selected for writing a target value. The threshold voltage of a subset of the memory cells of the block is then restored to the compacting range; the subset consists of the first memory cell and/or at least one second memory cell of the block being adjacent to the first memory cell. At the end, the target value is written (at least partially) into the first memory cell.

According to another embodiment, the subset comprises the first memory cell; in this case, at least one third memory cell adjacent to the first memory cell is selected, restored and partially written before completing the writing of the first memory cell.

In a specific implementation, the memory cells are multi-level.

The restoring and the writing may be partially overlapped for a page of first memory cells.

Particularly, the partial writing refers to a single bit of the memory cells.

In a further embodiment, the subset comprises the second memory cell(s).

Advantageously, a few starting memory cells are restored just after erasing the block.

Preferably, a single second memory cell is restored.

A preferred restoring sequence is also suggested.

A further embodiment provides a corresponding software program.

A further embodiment provides a flash memory device.

BRIEF DESCRIPTION OF THE DRAWINGS

The present invention, as well as further features and the advantages thereof, will be best understood by reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein.

Particularly:

FIGS. 5A through 5L illustrate a writing sequence of the memory cells according to a further embodiment of the present invention.

DETAILED DESCRIPTION

Figure 1:
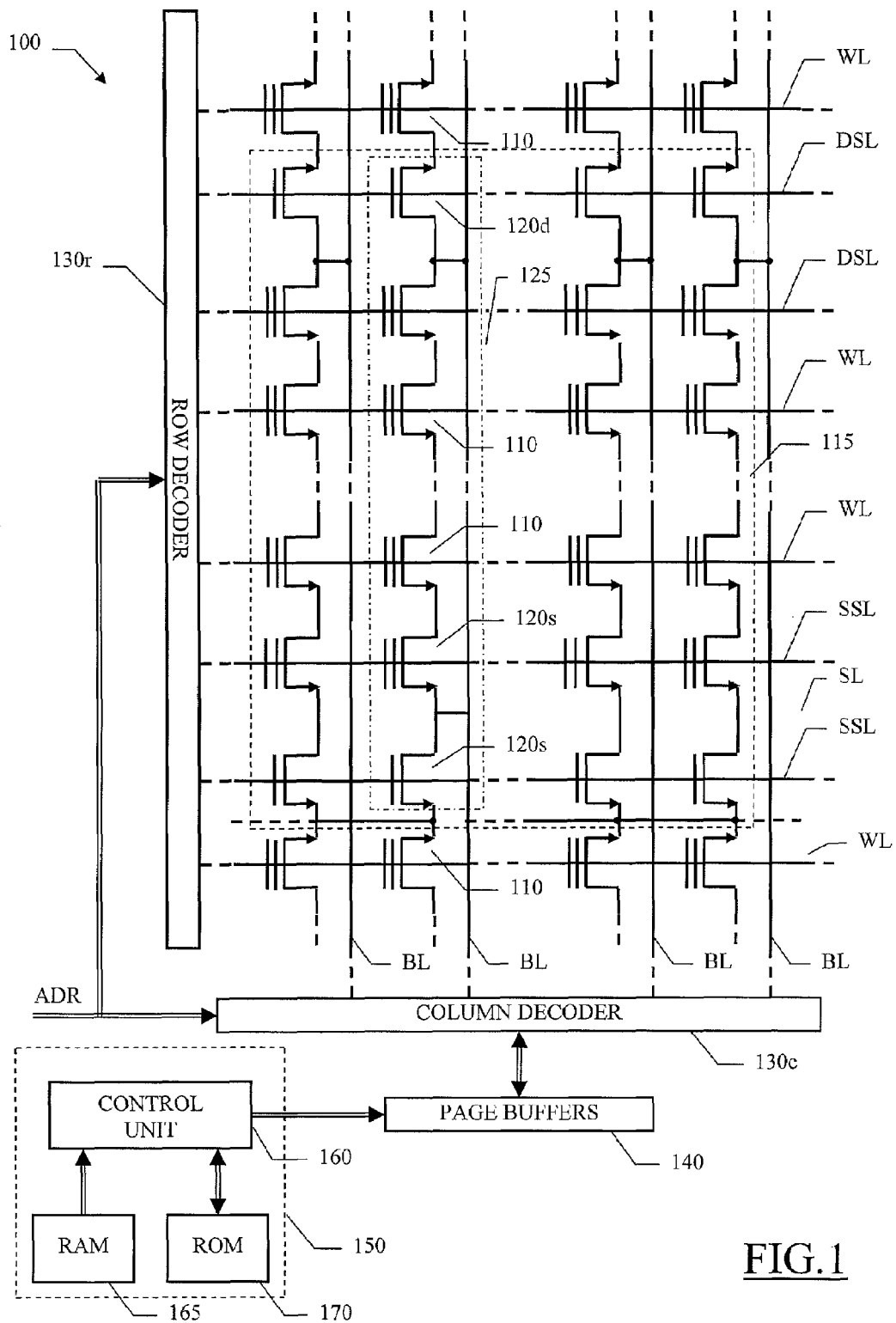
FIG. 1 shows a basic block diagram of a memory device in which the solution according to an embodiment of the present invention can be used.

With reference in particular to FIG. 1, a non-volatile semiconductor memory device of the flash type 100 is shown. The memory device 100 includes a matrix of cells 110, typically realized by floating-gate MOS transistors; the matrix includes one or more blocks 115, each one being erasable individually.

The memory device 100 is a multi-level memory, particularly (for the sake of simplicity) a four-level memory wherein each cell 110 is adapted to store a two-bit logic value comprising a Least Significant Bit (LSB) and a Most Significant Bit (MSB). More in particular, the cell 110 can be set in any one of four different states, each one associated with a corresponding logic value of the pair of bits. The state of the cell 110 is defined by its threshold voltage; in the example at issue, the threshold voltage of the cell 110 can take one of four different levels.

A typical choice (so-called Gray code) is to define the logic values corresponding to the different states of the cell 110 according to a sequence "11", "10", "00", "01", with the logic value "11" that is associated with the state having the lowest threshold voltage (erased state), and the others associated in succession with (programmed) states having increasing threshold voltages.

The cells 110 are arranged in a plurality of rows and columns. The memory device 100 has NAND type architecture. In this configuration, each block 115 includes a plurality of strings 125 that are connected in parallel; each string 125 is formed by a set of cells 110 (e.g., 16 or 32) that are connected in series between two select transistors 120s and 120d. In detail, an intermediate cell 110 of the string 125 has the drain terminal connected to the source terminal of an upper cell 110 and the source terminal connected to the drain terminal of a lower cell 110. The first (lowest) cell 110 of the string 125 has the source terminal connected to the drain terminal of the select transistor 120s, while the last (uppermost) cell 110 of the string 125 has the drain terminal connected to the source terminal of the select transistor 120d. Moreover, the select transistor 120s has the source terminal connected to the source terminal of the select transistor 120s of a lower string and the select transistor 120d has the drain terminal connected to the drain terminal of the select transistor 120d of an upper string. The gate terminals of the cells 110 of each row are connected to a corresponding word line WL. The drain terminals of the select transistors 120d of the strings of each column are connected to a corresponding bit line BL. The gate terminals of the select transistors 120d positioned on a same row are connected to a corresponding drain select line DSL; likewise, the gate terminals of the select transistors 120s positioned on a same row are connected to a corresponding source select line SSL. Moreover, the source terminals of all the select transistors 120s are connected to a common source line SL, which is typically maintained at a reference voltage (or ground).

The cells 110 belonging to the same row are logically partitioned into different pages. Assuming, merely by way of example, that the matrix of cells 110 includes 8192 bit lines BL, two pages of 4096 cells for each word line WL are defined (for example, with a first page comprising the cells 110 in an even position, and a second page comprising the cells 110 in an odd position). The memory device 100 further includes a battery of page buffers 140 (which are used for reading and for writing selected cells 110). Particularly, a different page buffer 140 is provided for each pair of even and odd bit lines BL.

The memory device 100 receives an address ADR for selecting the desired page. A portion of the address ADR is supplied to a row decoder 130r that selects the word line WL of the desired page, and the drain select line DSL and the source select line SSL of the corresponding strings. Another portion of the address ADR is supplied to a column decoder 130c; the column decoder 130c connects the bit lines BL of the desired page (that is, the even ones or the odd ones) to the corresponding page buffers 140.

The operation of the flash memory 100 is managed by a micro-controller 150. Particularly, the micro-controller 150 includes a control unit 160 that drives the page buffers 140. The control unit 160 uses a RAM 165 as a working memory. Operation of the control unit 160 is controlled by a low-level software program (or firmware), which is stored in a ROM 170.

Figure 2:
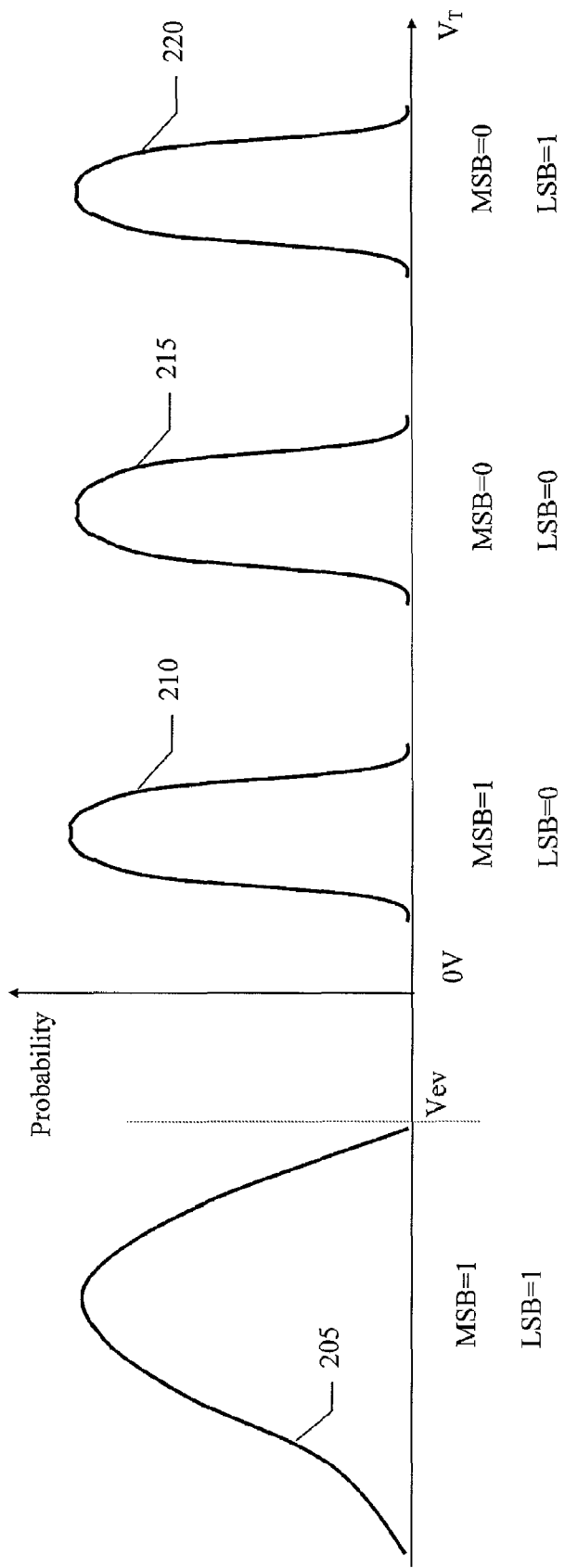
FIG. 2 shows simplified statistical distributions of the threshold voltages of the memory cells.

Considering now FIG. 2, exemplary statistical distributions 205, 210, 215 and 220 of the threshold voltages of the cells are shown. The distributions 205, 210, 215 and 220 are represented in a diagram having the probability on the axis of ordinates, in logarithmic scale, and the value of the threshold voltage ($V_T$) on the axis of the abscissas.

More particularly, the distribution 205 indicates the distribution of the threshold voltages in the erased state, i.e., associated with the logic value "11" (MSB=1, LSB=1). The distribution 210 indicates the distribution of the threshold voltages in a first programmed state, associated with the logic value "10" (MSB=1, LSB=0), the distribution 215 indicates the distribution of the threshold voltages in a second programmed state, associated with the logic value "00" (MSB=0, LSB=0), and the distribution 220 indicates the distribution of the threshold voltages in a third programmed state, associated with the logic value "01" (MSB=0, LSB=1). The (programmed) distributions 210, 215, 220 are quite narrow (for example, with a width of about 0.4-0.5V). Conversely, the (erased) distribution 205 is far more larger; for example, the erased distribution 205 has a width of about 4-5V, below an erase verify value Vev (such as, −0.5V) lower than an erase reference value (such as 0V), and exhibits a tail extending to the left due to the cells having very negative threshold voltages.

During a writing operation of a generic selected cell, both the LSB and the MSB of a target value are stored into the cell.

Typically, the writing operation starts with the LSB of the selected cell. Assuming that the writing operation is performed on an erased cell (i.e., with LSB=1 and MSB=1), if the LSB of the target value is equal to 0 the cell 110 is programmed in such a way to bring its threshold voltage (by applying a suitable programming voltage to the corresponding word line) from the erased distribution 205 to the programmed distribution 210; vice versa, the threshold voltage of the cell remains in the erased distribution 205. After that, the writing operation is completed by acting on the MSB. More specifically, if the MSB of the target value is equal to 1, no further programming operation is needed; consequently, the threshold voltage of the cell remains at the value reached in the previous step (i.e., belonging to the erased distribution 205 if the LSB is equal to 1 or belonging to the programmed distribution 210 if the LSB is equal to 0). On the contrary, if the MSB of the target value is equal to 0 the cell 110 is programmed in such a way to bring its threshold voltage to the programmed distribution 215 (if the LSB is equal to 0) or to the programmed distribution 220 (if the LSB is equal to 1).

According to an embodiment of the present invention, for obtaining a significant reduction of the width of the erased distribution 205, a soft-compacting operation is performed individually on the selected cell during its writing. In particular, starting from the erased state ('11'), before programming the LSB, the soft-compacting operation is performed on the cell in order to shift the threshold voltage thereof to a less negative value.

Figure 3A:
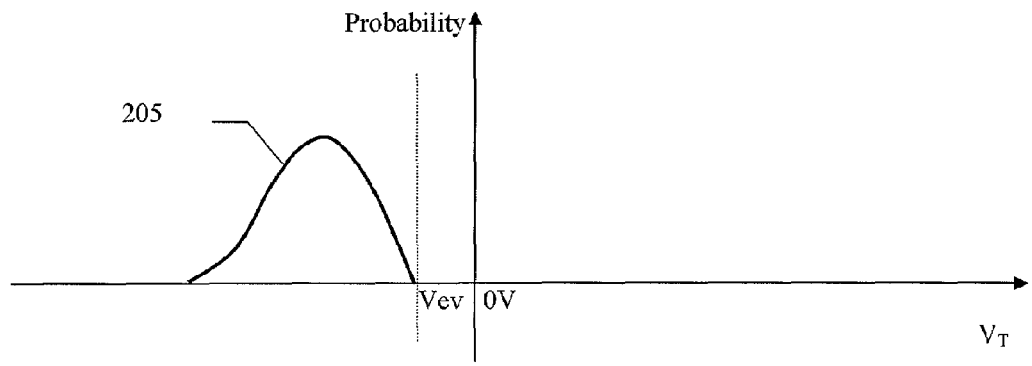
FIGS. 3A through 3C illustrate an exemplary implementation of the solution according to an embodiment of the present invention.
Figure 3B:
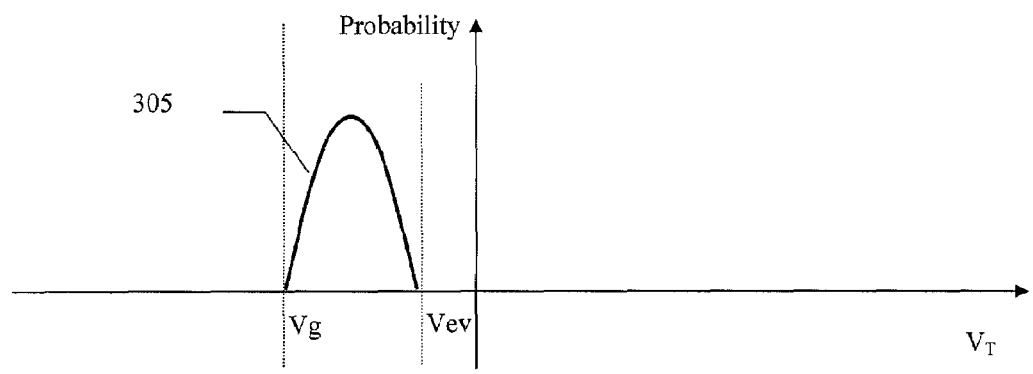
Figure 3C:
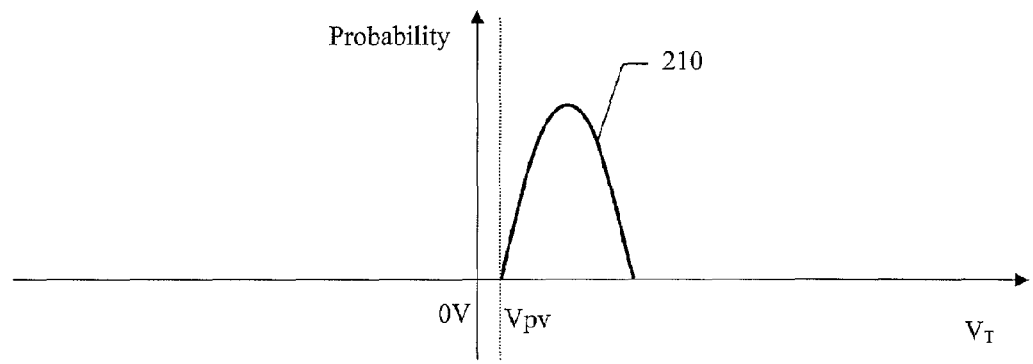

This soft-compacting operation is illustrated in greater detail in FIGS. 3A through 3C (wherein elements identical or similar to those shown in FIG. 2 are denoted by the same reference numerals).

Starting from FIG. 3A, the erased distribution 205 is shown (extending for 4-5V below the erase verify value Vev). A soft-programming pulse (for example, having a length typically equal to a ten of μs and an initial value of 6V) is then applied to the word line of the cell so as to increase its threshold voltage slightly (for example, by 0.2V). The cell is then read to verify whether its threshold voltage has reached a desired guard value Vg, below the erase verify value Vev (such as −3V). It should be noted that this verification requires applying a negative voltage (equal to the guard value Vg) to the word lines during the reading; in order to avoid providing a negative decoding structure, it is also possible to use a lower evaluation time during the reading, as described in European Patent Application No. EP05106976.3. The steps described above are reiterated (by slightly increasing the soft-programming pulse) until the threshold voltage of the cell exceeds the guard value Vg.

Moving to FIG. 3B, the same erased distribution after the soft-compacting operation takes a shape represented with a curve 305. In such a case, the threshold voltage of all the cells is brought over the desired guard value Vg (i.e., in the range from Vg to Vev); it should be noted that the distribution 305 is more compacted than the one shown in the preceding figure; in particular, the tail of the distribution due to the cells having very low threshold voltages is strongly reduced; such result is obtained thanks to the selective programming of the cells having the threshold voltages lower than the guard value Vg (being possible because of their individual verification). As a result, the distribution 305 has a reduced width (for example, 0.5-0.6V).

However, this does not have any impact on the erasing time of the memory device (since the soft-compacting operations of the cells are distributed through their writing operations); of course, this causes a slight increase of the writing time of each cell, which increase is however negligible in practice.

As mentioned above, the LSB of the cell is then written. In particular, when the LSB of the target value is equal to 1, no programming operation is necessary and the threshold voltage of the cell remains in the distribution 305.

Vice versa, when the LSB of the target value is equal to 0, the threshold voltage is brought to the state associate with the programmed distribution 210 shown in FIG. 3C. For this purpose, a writing pulse (for example, having the same length as above but a higher initial value of 15V) is applied to the word line of the cell so as to increase its threshold voltage substantially (for example, 1V). The cell is then read to verify whether its threshold voltage has reached a program verify value Vpv (such as, 1V) delimiting the corresponding state. The steps described above are reiterated (by slightly increasing the programming pulse) until the threshold voltage of the cell exceeds the program verify value Vpv.

Figure 4:
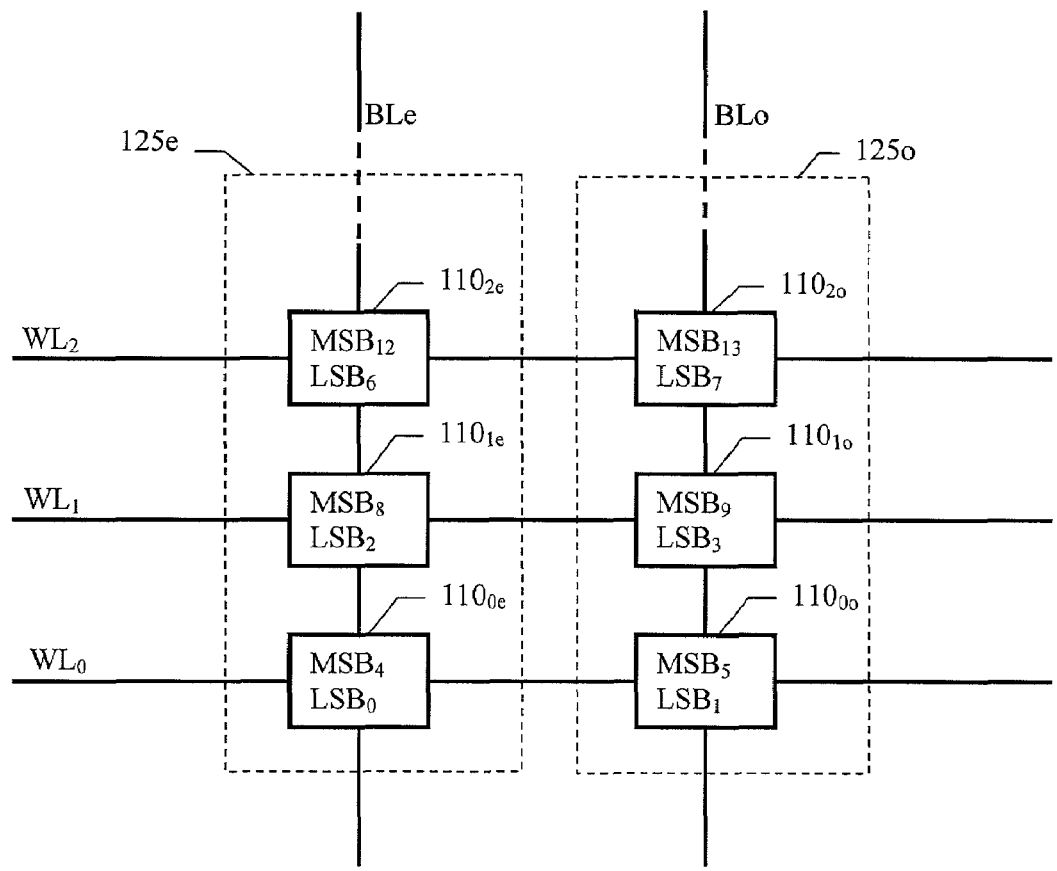
FIG. 4 shows a writing sequence of the memory cells according to an embodiment of the present invention.

The above-described solution is particularly advantageous when the memory cells are written in a sequence known as interlaced. In order to illustrate this technique, FIG. 4 shows a set of cells belonging to two adjacent strings associated with a pair of even and odd bit lines (differentiated by adding an index "e" and "o" to their references). The corresponding word lines are ordered from the bottom, as indicated by adding an increasing index (for the sake of simplicity, only the word lines $WL_0$, $WL_1$ and $WL_2$ are shown in the figure). It is then possible to differentiate the cells by means of the indexes of the corresponding word lines $WL_0$-$WL_2$ and bit lines BLe-BLo. The writing sequence of the LSB and MSB of the target value in each cell $110_{0e}$-$110_{2o}$ is represented in the figure by the reference LSB, MSB with the addition of an increasing index.

In a first phase, the cell $110_{0e}$ (associated with the word line $WL_0$ and the bit line BLe) is selected and the above-described soft-compacting operation is performed (in order to bring its threshold voltage within the range from the guard value Vg to the erase verify value Vev). Then, the corresponding writing operation is partially performed in order to write the LSB of the target value (denoted with $LSB_0$). As explained above, if $LSB_0$=1 the cell 110 remains unchanged, while if $LSB_0$=0 the cell 110 is programmed in order to bring its threshold voltage over the program verify value Vpv.

The same operations (i.e., soft-compacting and writing of the LSB) are repeated for the cell $110_{0o}$ ($LSB_1$), for the cell $110_{1e}$ ($LSB_2$), and for the cell $110_{1o}$ ($LSB_3$).

The sequence then returns to the cell $110_{0e}$ for writing the MSB of the corresponding target value ($MSB_4$), thereby completing its processing.

As can be appreciated, when the writing of the cell $110_{0e}$ is completed, its adjacent cells $110_{0o}$, $110_{1e}$ and $110_{1o}$, have been already soft-compacted so that the capacitive coupling is reduced, disregarding the adjacent cells associated with another pair of even/odd bit lines (not shown in figure because less critical). Then, the same operation is repeated so as to complete the writing of the cell $110_{0o}$ ($MSB_5$); in this case as well, the adjacent cells $110_{1e}$, $110_{1o}$ and $110_{0e}$ have already been soft-compacted.

The writing sequence continues by soft-compacting and partially writing the cell $110_{2e}$ ($LSB_6$) and the cell $110_{2o}$ ($LSB_7$).

As above, the sequence returns to complete the writing of the cell $110_{1e}$ ($MSB_8$) and of the cell $110_{1o}$ ($MSB_9$), and so on.

As an alternative of the above-proposed solution, it is also possible to perform the soft-compacting operation together with the writing operation. More in detail, after a page of cells has been selected for writing, a series of voltage pulses is applied to all the selected cells. The pulse starts from a value of 10V, and it is increased in succession by 0.2V. At every iteration with the pulse from 10V to 12V, each cell to be soft-compacted is read to verify whether its threshold voltage has reached the guard value Vg (with the application of the pulse to the cell that is stopped as soon as the desired condition is reached). At every next iteration with the pulse from 12V to 14V, each cell still to be soft-compacted is read with respect to the guard value Vg and each cell to be programmed is read with respect to the program verify value Vpv (stopping the application of the pulse as soon the corresponding conditions are reached). Then, at every next iteration with the pulse from 14V to 16V, each cell still to be programmed is read with respect to the program verify value Vpv (again stopping the application of the pulse as soon the desired condition is reached). In this way, the soft-compacting operation and the programming operation are partially overlapped; this reduces any overhead of the writing time caused by the proposed solution.

The soft-compacting operation according to a further embodiment of the present invention is illustrated in detail in FIGS. 5A through 5L (wherein elements identical or similar to those shown in FIG. 4 are denoted by the same reference numerals).

Figure 5A:
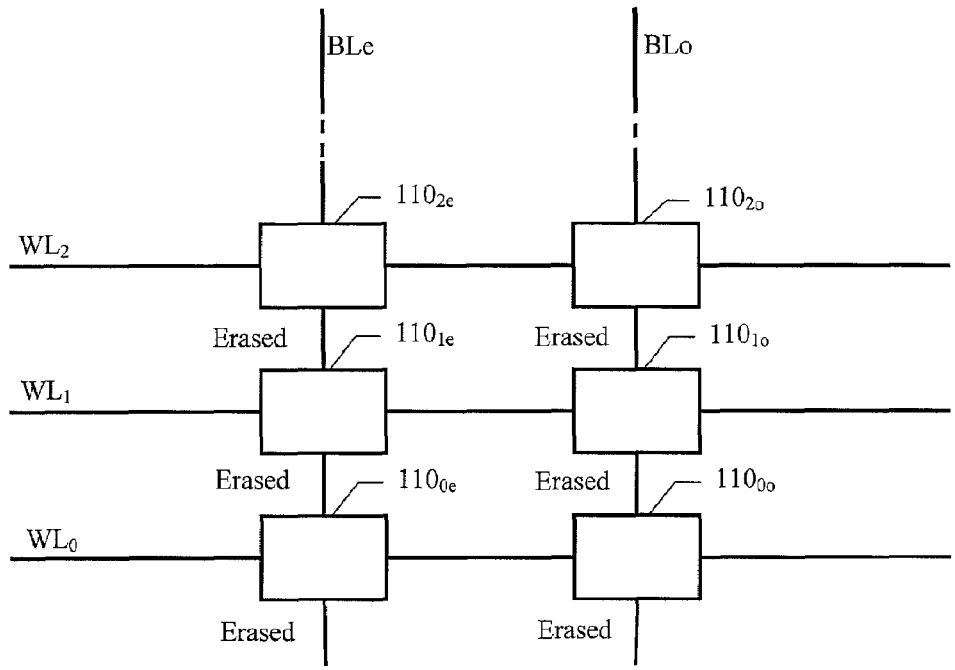

Considering in particular FIG. 5A, the condition following an erasing operation is illustrated; in this case the cells $110_{0e}$-$110_{2o}$ are all erased.

Figure 5B:
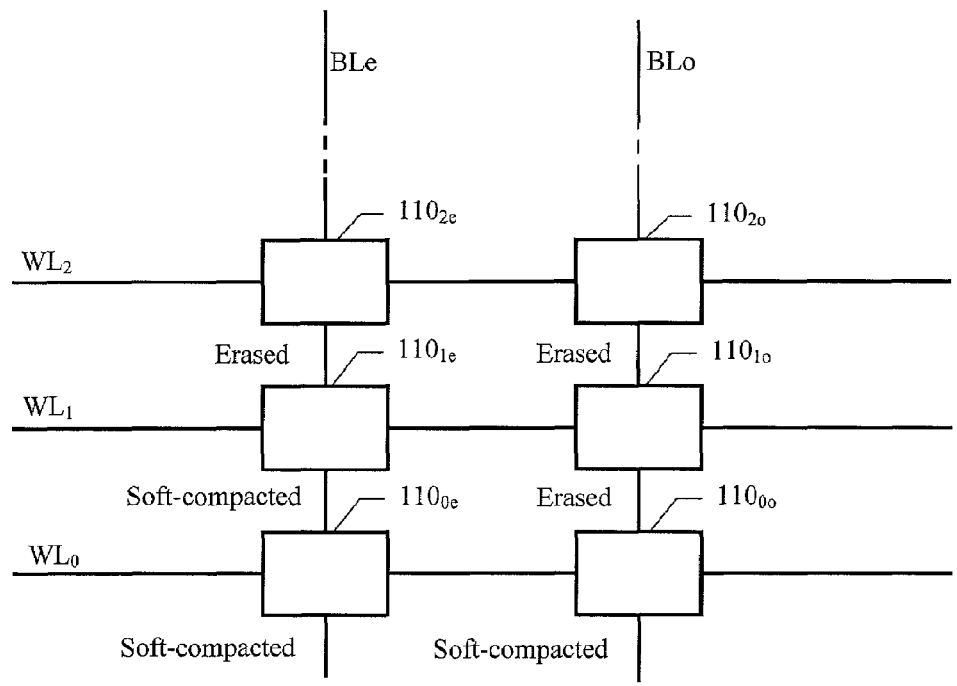

Moving to FIG. 5B, immediately after that the soft-compacting operation is performed (for example, during a last phase of the erasing operation) on the first three cells to be written $110_{0e}$, $110_{0o}$, $110_{1e}$ (in order to bring their threshold voltages within the range from the guard value Vg to the erase verify value Vev).

Figure 5C:
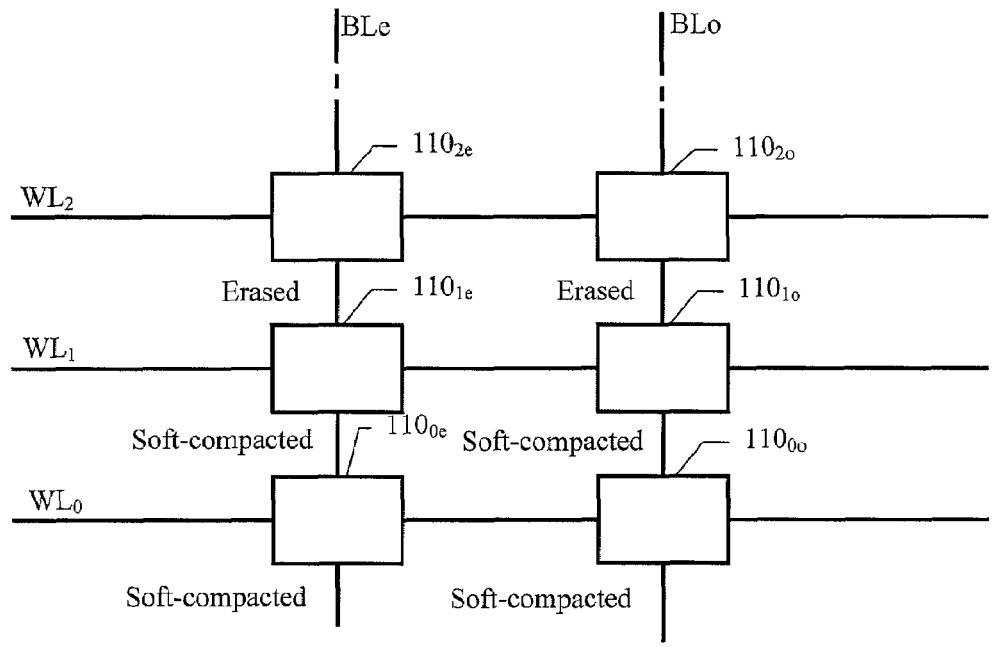

With reference now to FIG. 5C, let us assume that the writing sequence starts from the cell $110_{0e}$. In this case, before writing the cell $110_{0e}$ the soft-compacting operation is performed on the cell $110_{1o}$.

Figure 5D:
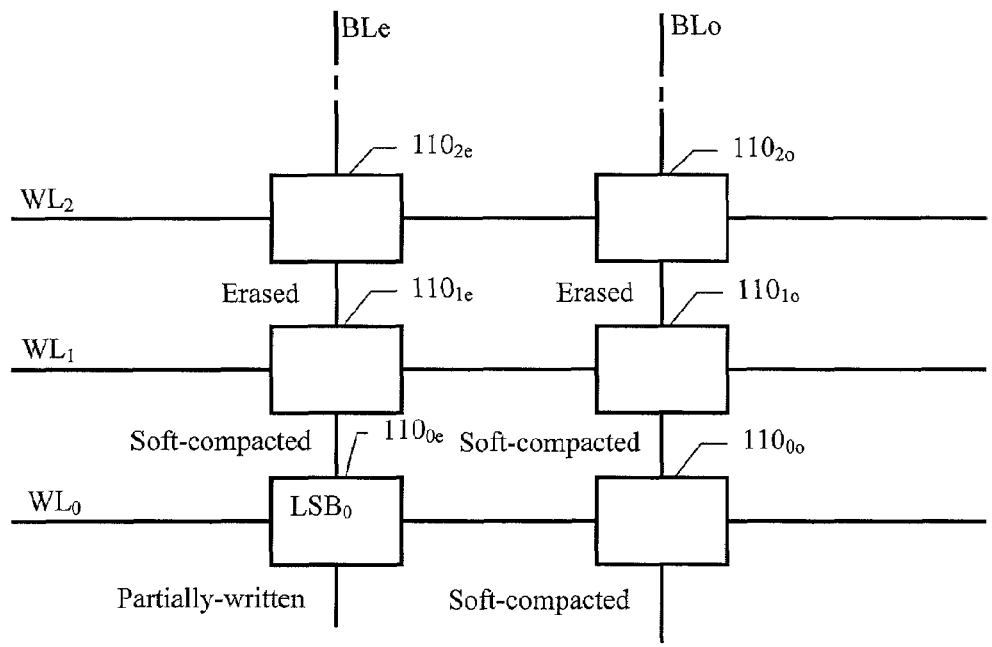

Moving to FIG. 5D, the desired target value is partially written (LSB$_0$) into the cell $110_{0e}$. As explained above, if LSB$_0$=1 the cell $110_{0e}$ remains unchanged, while otherwise the cell $110_{0e}$ is programmed accordingly. In this case as well, when the cell $110_{0e}$ is partially written (LSB$_0$), its adjacent cells $110_{0o}$, $110_{1e}$ and $110_{1o}$, have been already soft-compacted so that the capacitive coupling is reduced. In particular, the reduction of the capacitive coupling effects occurs during the writing of the LSB of the target value of each selected cell. This feature is particularly advantageous when the target value, which is to be stored into the selected cell, corresponds to the first programmed state ('10') so that no further program operation is needed. Indeed, in this case the writing of the adjacent cells (already soft-compacted) does not affect the stored logic value.

Figure 5E:
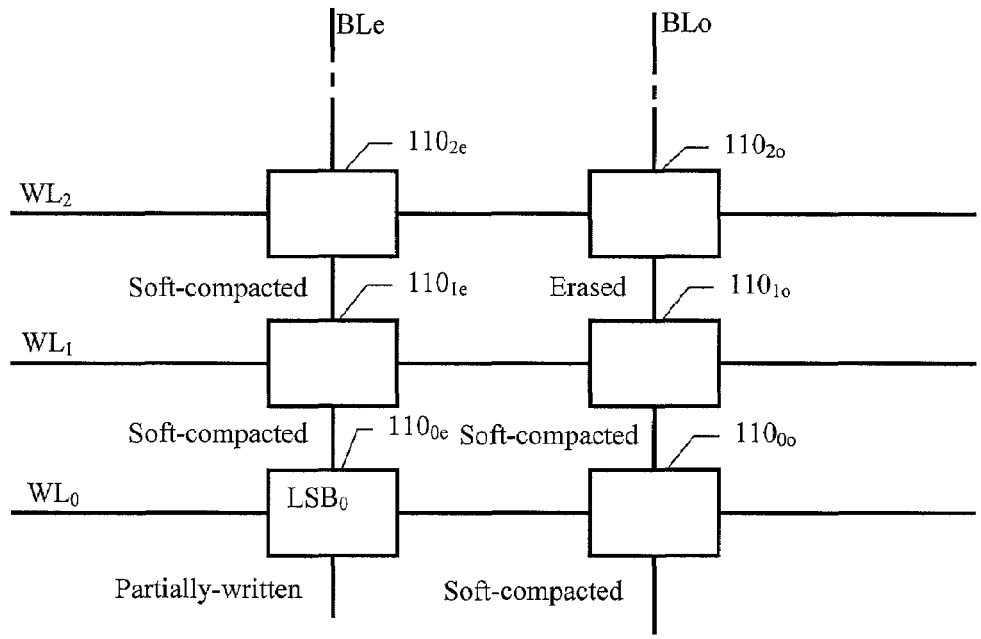

Considering FIG. 5E, the writing sequence passes to the cell $110_{0o}$. As above, before writing the cell $110_{0o}$ the soft-compacting operation is performed on the cell $110_{2e}$.

Figure 5F:
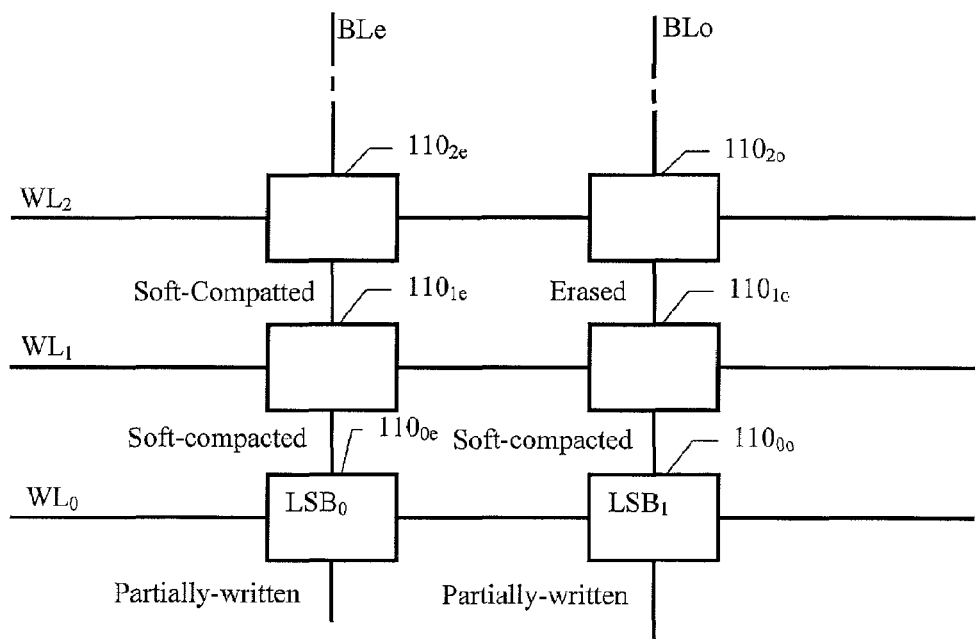

Moving to FIG. 5F, the desired target value is partially written (LSB$_1$) into the cell $110_{0o}$; again, when the cell $110_{0o}$ is written its adjacent cells $110_{1e}$, $110_{1o}$ and $110_{0e}$ have already been soft-compacted.

Figure 5G:
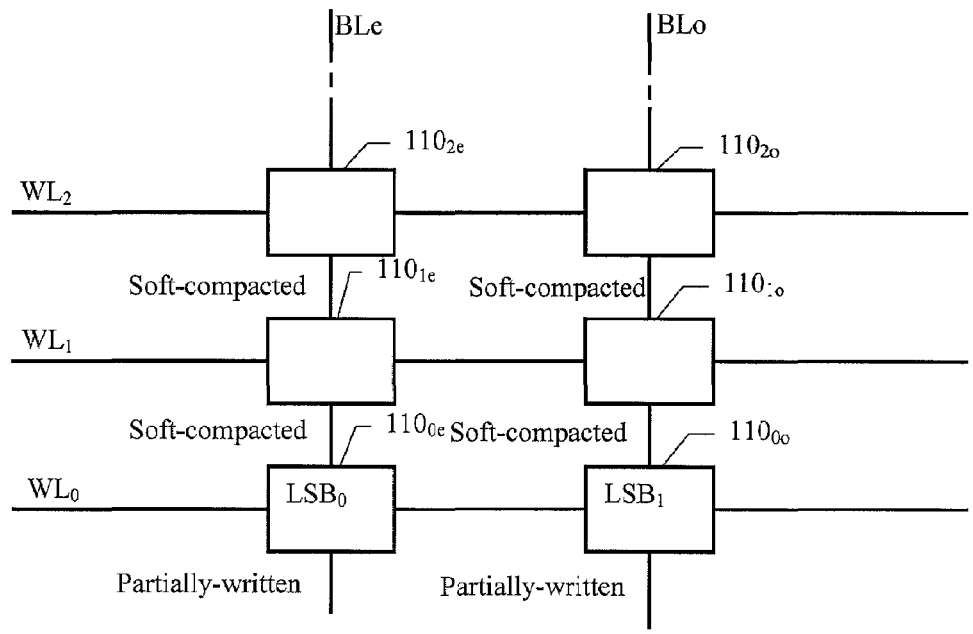

Considering FIG. 5G, the writing sequence passes to the cell $110_{1e}$. As above, before writing the $110_{1e}$ the soft-compacting operation is performed on the cell $110_{2o}$.

Figure 5H:
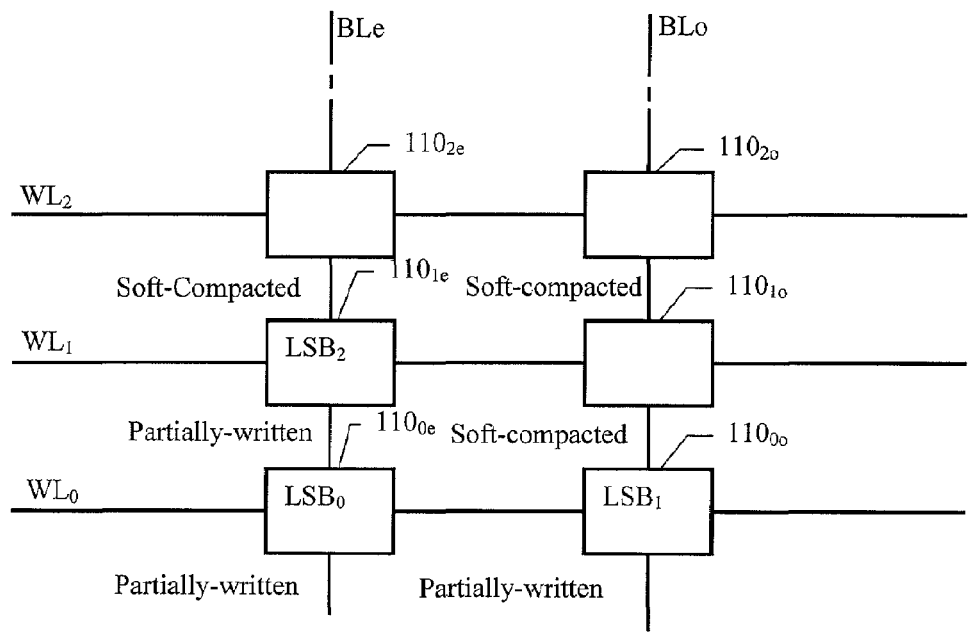

Moving to FIG. 5H, the cell $110_{1e}$ is partially written (LSB$_2$), with its adjacent cells $110_{0e}$, $110_{1o}$ and $110_{2e}$ that are already soft-compacted.

Figure 5I:
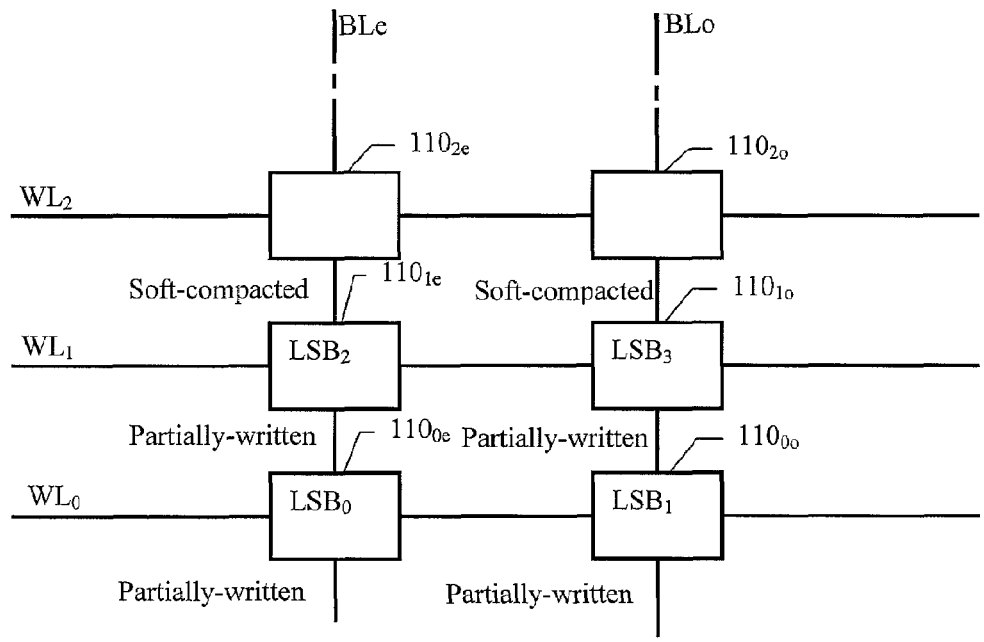

With reference to FIG. 5I, the same operations, i.e., soft-compacting the cell—not shown in figure—associated with the even bit line BLe and the row following the row WL$_2$, and retuning to partially write (LSB$_3$) the cell $110_{1o}$ are repeated.

Figure 5L:
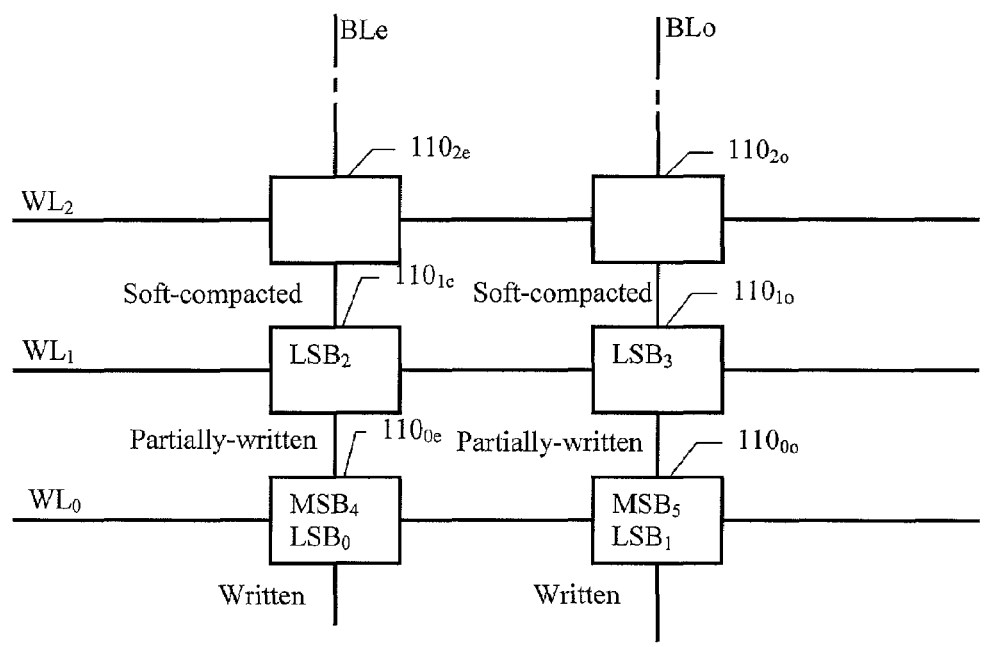

Considering FIG. 5L, the writing sequence returns to complete the writing of the cell $110_{0e}$ (MSB$_4$) and of the cell $110_{0o}$ (MSB$_5$), and so on.

Of course, when the writing of the cell $110_{0e}$ and $110_{0o}$ is completed, its adjacent cells, $110_{0o}$, $110_{1e}$, $110_{1o}$ and $110_{0e}$, $110_{1e}$, $110_{1o}$, respectively, have been already soft-compacted.

Naturally, in order to satisfy local and specific requirements, a person skilled in the art may apply to the solution described above many modifications and alterations. Particularly, although the present invention has been described with a certain degree of particularity with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has another structure with a different number of rows and columns, or if it includes equivalent components. Moreover, the numerical examples are merely indicative, and they have not to be considered in a limitative way.

It is emphasized that, although the proposed solution is particularly advantageous in a memory device with NAND architecture, especially of the multi-level type, the proposed solution lends itself to be applied in any other flash memory device (for example, with standard two-level cells, and even with NOR architecture).

Similar considerations apply if the threshold voltage of the relevant cells is restored with a different procedure.

In any case, although in the preceding description two specific embodiments of the invention have been described in detail (wherein the restoring is applied at any time to a subset of erased cells comprising the cell being selected for writing or of its adjacent cells, respectively) nothing prevents combining them at will (so as to apply the restoring to both the cell being selected for writing and one or more of its adjacent cells).

Considering now the embodiment of the invention based on the restoring of the cell being selected for writing, a different number of adjacent cells (down to a single one) may be soft-compacted before returning to complete the writing of the selected cell; in any case, the application of the proposed solution to writing sequences different from the interlaced one is within the scope of the invention.

Similar considerations apply if each memory cell may take a different number of states (with multiple programmed states); for example, this number may also be not a power of two in memory cells of fractional type.

Alternatively, nothing changes if the MSB is written into the selected cell, its adjacent cells are soft-compacted, and the writing of the selected cell is completed with the LSB; more generally, the same solution may be applied to a generic bit of the target value to be written in the selected cell (when consisting of two or more bits).

Passing to the embodiment based on the restoring of the cells adjacent to the selected one, the process may be applied to different adjacent cells without departing from the scope of the invention (for example, only the one on the same row or on the same column of the selected cell).

It is possible that a general variant of the proposed solution provides the soft-compacting operation during the erase operation of a different number of cells (down to a single one).

Consequently, nothing prevents soft-compacting two or more cells before writing the selected one (even if this adversely affects the writing speed of the memory device).

Likewise, the above-described writing sequence should not be interpreted in a limitative manner; for example, it is possible to apply the same solution of this embodiment of the invention even when the cells are written in a standard way (i.e., completely with both the LSB and the MSB in a single step).

Similar considerations apply if an equivalent software program is used to implement each embodiment of the invention. Moreover, the proposed solution lends itself to be implemented with an equivalent method (by using similar steps, removing some steps being not essential, or adding further optional steps—even in a different order). In any case, the program may take any form suitable to be used by or in connection with any micro-controller of the memory device. Moreover, it is possible to provide the program on any computer-usable medium; the medium can be any element suitable to contain, store, communicate, propagate, or transfer the program. For example, the medium may be of the electronic, magnetic, optical, electromagnetic, infrared, or semiconductor type. In any case, the solution according to the present invention lends itself to be implemented even with a hardware structure or a combination of software and hardware.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting.

The invention is limited only as defined in the following claims and the equivalents thereto.

What is claimed is:

1. A method for operating a flash memory device including a matrix of memory cells each one having a programmable threshold voltage defining a value stored in the memory cell, wherein the method includes the steps of:
   erasing a block of memory cells, and
   compacting the threshold voltages of the memory cells of the block within a predefined compacting range,
   wherein the step of compacting includes:
     selecting at least one first memory cell of the block for writing a target value;
     restoring the threshold voltage of a subset of the memory cells of the block to the compacting range, the subset comprising the at least one first memory cell and/or at least one second memory cell of the block being adjacent to the at least one first memory cell; and
     at least partially writing the target value into the at least one first memory cell.

2. The method according to claim 1, wherein the subset comprises the at least one first memory cell, and the at least partially writing comprises partially writing, the step of compacting further including:
   the selecting, restoring and partially writing of at least one third memory cell of the block being adjacent to the at least one first memory cell, and
   completing the writing of the target value into the at least one first memory cell.

3. The method according to claim 2, wherein the value stored in each memory cell is defined by a level of the threshold voltage selected among an erased level and a plurality of programmed levels, each erased memory cell having the threshold voltage at the erased level, wherein the step of partially writing includes:
   leaving the at least one first memory cell unaffected or programming the at least one first memory cell to bring the threshold voltage to a first programmed level adjacent to the erased level according to the target value, and
   wherein the step of completing the writing includes:
     leaving the at least one first memory cell unaffected or programming the at least one first memory cell to bring the threshold voltage to another programmed level different from the first programmed level according to the target value.

4. The method according to claim 3, wherein the at least one first memory cell comprises a page of first memory cells, the steps of restoring and partially writing the first memory cells including:
   applying a series of increasing first pulses to all the first memory cells, the application of the first pulses being individually disabled for each first memory cell not to be programmed once restored,
   applying a series of further increasing second pulses to each first memory cell still to be restored or to be programmed, the application of the second pulses being individually disabled for each first memory cell not to be programmed once restored and for each first memory cell to be programmed once programmed, and
   applying a series of still further increasing third pulses to each first memory cell still to be programmed, the application of the third pulses being individually disabled for each first memory cell to be programmed once programmed.

5. The method according to claim 3, wherein the value stored in each memory cell is represented by a plurality of bits, the erased level and the first programmed level being associated with different conditions of one of the bits and a same condition of the remaining bits.

6. The method according to claim 1, wherein the subset comprises the at least one second memory cell.

7. The method according to claim 6, wherein the memory cells of the block are written in succession according to a predetermined writing sequence, the step of compacting further including, before selecting a starting first memory cell of the sequence:
   the restoring of the starting first memory cell and at least one third memory cell of the block being adjacent to the starting first memory cell different from the corresponding at least one second memory cell.

8. The method according to claim 7, wherein the at least one second memory cell comprises a single second memory cell.

9. The method according to claim 8, wherein the matrix is arranged in a plurality of rows and columns with the columns grouped in pairs each one of an even column and an odd column associated with a common page buffer, wherein the memory cells are ordered in the writing sequence from each memory cell in the even column to the memory cell in the same row and in the odd column, and from each memory cell in the odd column to the memory cell in the even column and in the next row, and wherein the second memory cell corresponding to each first memory cell in the even column comprises the memory cell in the odd column and in the next row, and the second memory cell corresponding to each first memory cell in the odd column comprises the memory cell in the even column and in the second next row.

10. A software program for performing the method of claim 1, wherein when the program is executed in a microcontroller of a flash memory device.

11. A flash memory device including means for performing the steps of the method according to claim 1.

* * * * *